(12) United States Patent  (10) Patent No.: US 7,554,476 B2
Inada  (45) Date of Patent: Jun. 30, 2009

(54) AD CONVERSION METHOD, APPARATUS THEREOF, SOLID-STATE IMAGING DEVICE, DRIVING METHOD THEREOF, AND IMAGING APPARATUS

(75) Inventor: Yoshiaki Inada, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/971,592

(22) Filed: Jan. 9, 2008

(65) Prior Publication Data

US 2008/0169955 A1    Jul. 17, 2008

(30) Foreign Application Priority Data

Jan. 16, 2007  (JP) ............................. 2007-007264

(51) Int. Cl.
  *H03M 1/12* (2006.01)
(52) U.S. Cl. ...................................... 341/156; 341/155
(58) Field of Classification Search ................ 341/155, 341/156, 164, 165; 382/207, 218, 219
See application file for complete search history.

(56) References Cited

U.S. PATENT DOCUMENTS

| 5,349,354 | A | * | 9/1994 | Ito et al. ...................... 341/156 |
| 5,936,566 | A | * | 8/1999 | Park .............................. 341/159 |
| 5,973,632 | A | * | 10/1999 | Tai ............................... 341/156 |
| 6,549,155 | B1 | * | 4/2003 | Heminger et al. ........... 341/144 |
| 7,064,694 | B1 | * | 6/2006 | Male et al. ................... 341/129 |
| 7,324,033 | B2 | * | 1/2008 | Asayama et al. ............ 341/145 |

FOREIGN PATENT DOCUMENTS

| JP | 11-168383 | 6/1999 |
| JP | 2002-232291 | 8/2002 |
| JP | 2003-198372 | 7/2003 |
| JP | 2003-259151 | 9/2003 |
| JP | 2005-347932 | 12/2005 |
| JP | 2005-348325 | 12/2005 |
| JP | 2006-278135 | 10/2006 |

OTHER PUBLICATIONS

Japanese Office Action Issued on Dec. 17, 2008.

* cited by examiner

*Primary Examiner*—Peguy JeanPierre
(74) *Attorney, Agent, or Firm*—Sonnenschein Nath & Rosenthal LLP

(57) ABSTRACT

An analog-to-digital conversion method includes the steps of outputting an upper-bit conversion reference signal, obtaining a digital value of upper bits on the basis of a period of time from a set time to the time when a magnitude relation between the analog signal and the upper-bit conversion reference signal is determined to be changed, generating and outputting a lower-bit conversion reference signal, obtaining a digital value of lower bits on the basis of a period of time from a set time to the time when a magnitude relation between the analog signal and the lower-bit conversion reference signal is determined to be changed, and determining a digital value of digital data converted from the analog signal on the basis of the digital value of the upper bits and the digital value of the lower bits.

17 Claims, 14 Drawing Sheets

US 7,554,476 B2

AD CONVERSION METHOD, APPARATUS THEREOF, SOLID-STATE IMAGING DEVICE, DRIVING METHOD THEREOF, AND IMAGING APPARATUS

CROSS REFERENCES TO RELATED APPLICATIONS

The present invention contains subject matter related to Japanese Patent Application JP 2007-007264 filed in the Japanese Patent Office on Jan. 16, 2007, the entire contents of which are incorporated herein by reference.

BACKGROUND OF THE INVENTION

1. Field of the Invention

The present invention relates to an analog-to-digital (AD) conversion method, an AD conversion apparatus, a solid-state imaging device, a solid-state imaging device driving method, and an imaging apparatus which can reduce the number of clock cycles necessary for performing AD conversion and also shorten a period of time necessary for AD conversion by preparing a digital-to-analog converter (DAC) reference signal for converting upper bits and by preparing that for converting lower bits.

2. Description of the Related Art

Solid-state imaging devices, such as a charge-coupled device (CCD) or a complementary metal oxide semiconductor (CMOS), have been used in many applications. Recently, a MOS-type solid-state imaging device which is suitable for Next, basic operations of the MOS-type solid-state imaging device will be described.

In the MOS-type solid-state imaging device, the timing control circuit 119 selects unit pixels 111 in a row, and signal voltages of the unit pixels 111 selected are supplied to corresponding vertical signal lines.

Here, the DAC 115 and the comparator 116 and up/down counter 117 of a column are included in an AD converter circuit 120 employing a ramp DAC scheme. The AD converter circuit 120 converts an analog signal obtained from a pixel into a digital value.

The reference signal VREF generated by the DAC 115 is commonly supplied to comparators 116 of all columns, and the up/down counter 117 is independently provided to each of the columns.

The AD converter circuit 120 compares, at the comparator 116, a pixel signal that is output to the vertical signal line with the reference signal VREF whose value changes in steps, and obtains a digital value by incrementing or decrementing the up/down counter 117 during a period of time from a set time to the time when a magnitude relation between magnitude of a voltage of the pixel signal and that of the reference signal VREF is determined to be changed.

The pixel signal converted by the AD converter circuit 120 into the digital value is temporarily stored in the memory 118. Then, the value stored in the memory 118, which is a sequential memory, is read out by the column scanning circuit 114 to a horizontal output line, and thereby the read value is output outside the memory 118.

In many MOS-type solid-state imaging devices, when a pixel is reset, a voltage level of the vertical signal line is obtained, and then when light is incident on the pixel, a voltage level of the vertical signal line is obtained. Then, an operation for reducing a fixed-pattern noise due to an output circuit of each pixel is performed by obtaining a difference between the voltage level obtained when the pixel is reset and the voltage level obtained when light is incident on the pixel.

In the case of the MOS-type solid-state imaging device shown in FIG. 10, the up/down counter 117 is used to reduce the fixed pattern noise.

FIG. 11 is a timing chart showing operations of a MOS-type solid-state imaging device of the related art.

As shown in FIG. 11, first, a down-count operation is performed by using a counter when a reset level of a pixel is converted from analog to digital.

Next, an up-count operation starting from the count value for the reset level is performed by using the counter when light is incident on the pixel and when a voltage level of a vertical signal line of the pixel is converted from analog to digital when light is incident on the pixel. Thus, a difference in a digital domain can be obtained without using a subtracting circuit.

In the following description, a DAC-output ramp wave to which reference is made when AD conversion of the reset level is performed is referred to as a P-phase ramp wave, and a DAC-output ramp wave to which reference is made when AD conversion is performed when light is incident on the pixel is referred to as a D-phase ramp wave.

In such a MOS-type solid-state imaging device, with the refinement of fabrication techniques in recent years, it has become possible to provide a transistor of a smaller size in the comparator 116, and it is necessary to provide such a comparator to each of the columns. As a result, deviation in input voltages of the comparators 116 of the columns increases pixel noise.

In order to cope with this, an input offset voltage is maintained across the capacitors Cp25 and Cp26 of the comparator 116 as shown in FIG. 12, and thus the input offset voltage is corrected.

FIG. 12 is a schematic circuit diagram showing an example of the comparator 116 of the AD converter circuit 120 in a MOS-type solid-state imaging device of the related art.

In FIG. 12, a switch transistor Tr21 is connected between the gate and drain of a transistor Tr23, and a switch transistor Tr22 is connected between the gate and drain of a transistor Tr24.

A pixel signal propagating a vertical signal line is input to the gate of the transistor Tr24 via a capacitor Cp26, and the reference signal VREF supplied from the DAC 115 is input to the gate of the transistor Tr23 via a capacitor Cp25.

The comparator is a circuit which causes an output L27 to be at a "high" level or at a "low" level on the basis of a magnitude relation between a voltage level of the pixel signal and that of the signal from the DAC.

The input offset voltage can be corrected by maintaining deviation in a threshold voltage of a differential stage due to the use of a small transistor in the comparator and deviation in the gate length and gate width of transconductance of the transistor Tr23 across the capacitor Cp25 and maintaining the deviation in the threshold voltage of the differential stage due to the use of the small transistor in the comparator and deviation in the gate length and gate width of transconductance of the transistor Tr24 across the capacitor Cp26.

Moreover, since both correction of the offset voltage and redefining of an inverted voltage of the comparator can be performed, a direct-current component of the vertical signal line and that of the signal from the DAC can be negligible.

Therefore, not only a circuit can be designed without consideration of a direct-current component of the pixel signal output to the vertical signal line and that of the ramp wave from the DAC, but also changes in the inverted voltage of the comparator due to chip-to-chip variation generated during manufacturing thereof can be corrected.

Next, operations for correcting the input offset voltage in the example shown in FIG. 12 will be described. First, it is necessary to maintain an input offset voltage and also to determine a reference voltage used for comparison. Hereinafter, this determination operation is referred to as an auto-zero operation.

When the auto-zero operation is performed, a reset level of a pixel signal (a pixel reset level) is input from the vertical signal line, and an auto-zero base signal (an auto-zero base voltage) is input from the DAC.

A PSET signal for performing the auto-zero operation is commonly supplied to the gate of the switch transistor Tr21 and that of the switch transistor Tr22.

At the timing corresponding to the rising edge of the PSET signal, the switch transistors Tr21 and Tr22 are turned on, and the comparator reaches a state of equilibrium. That is, an operation point is determined where the gate voltage of the switch transistor Tr21 and that of the switch transistor Tr22 are identical, or, if the input offset voltage exists, the circuit reaches a state of equilibrium at a corrected offset voltage.

Next, at the timing corresponding to the falling edge of the PSET signal, the switch transistors Tr21 and Tr22 are turned off, and the gate of the transistor Tr23 and that of the transistor Tr24 become floating gates.

Here, a potential difference between the pixel reset level of the vertical signal line and the gate voltage of the transistor Tr24 is maintained across the capacitor Cp26, and a potential difference between the auto-zero reference voltage and the gate voltage of the transistor Tr23 is maintained across the capacitor Cp25.

By performing the auto-zero operation, magnitude of a signal of the vertical signal line and that of the ADC can be compared in a state in which an offset voltage of the comparator is corrected.

FIG. 13 is a timing chart showing an auto-zero signal, a pixel output of the vertical signal line, and a base signal supplied from the DAC in AD conversion which is performed on an image signal and which includes the auto-zero operation.

FIG. 14 is a timing chart showing that a voltage of the vertical signal line and a voltage of the reference signal supplied from the DAC reach a state of equilibrium of the comparator when the auto-zero reference voltage is maintained.

By performing the operation for determining the auto-zero reference voltage (eliminating a direct-current component of the voltage of a comparing target), as shown in FIG. 14, the pixel output of the vertical signal line and the DAC reference voltage reach the state of equilibrium of the comparator (an inverted voltage of the comparator) when the auto-zero reference voltage is maintained (at the timing corresponding to the falling edge of the PSET signal).

After this, AD conversion is performed two times in total by comparing the pixel reset level for the vertical signal line with the P-phase ramp wave for the DAC and by comparing an incoming light signal for the vertical signal line with the D-phase ramp wave for the DAC. As a result, digital conversion can be performed on the resulting image signal obtained by eliminating both an offset component due to the output circuit of each pixel and an offset component due to the auto-zero operation performed within each AD converter circuit from the image signal.

SUMMARY OF THE INVENTION

In a solid-state imaging device of the related art, as shown in the timing chart of correlated double sampling (CDS) of FIG. 15, a voltage amplitude of the P-phase ramp wave serving as a reference signal used to convert the pixel reset level is determined on the basis of the offset voltage due to the auto-zero operation of the comparator. In this example, 1024 clock cycles are necessary for converting the pixel reset level.

If resolution for converting a level of a light signal incident on a pixel is 12 bits, the number of clock cycles necessary for converting the level of the light signal incident on the pixel is 4096 in addition to 1024 clock cycles for converting the pixel reset level, and the number of clock cycles necessary for the case of the D-phase ramp wave is 5120.

Even if the offset voltage due to the auto-zero operation of the comparator does not exist, 4096 clock cycles are necessary if the level of the light signal is converted with 12-bit resolution. This shows that pixel resolution of AD conversion and time necessary for the AD conversion simultaneously increase in a linear manner. In this scheme, there is a trade-off between the AD conversion resolution and a reading speed (one of the AD conversion resolution and the reading speed should be selected and it is not possible to select both of them simultaneously).

In order to solve such a problem, that is, in order to increase AD conversion resolution and a reading speed, two comparators or two operational amplifiers can be mounted; however, there is a disadvantage in terms of size since two comparators or two operational amplifiers are mounted.

In particular, in a column-parallel AD conversion method in which an AD converter is mounted in each column of a solid-state imaging device with high resolution, since it is necessary that an AD converter of each column has a pitch that is the same as the pixel pitch in the column-parallel AD conversion method, it is desired to reduce increase in size by reducing a circuit size of the AD converter as much as possible.

It is desirable to provide an AD conversion method, an AD conversion apparatus, a solid-state imaging device, a solid-state imaging device driving method, and an imaging apparatus which reduce the number of clock cycles necessary for performing AD conversion and also shorten a period of time necessary for AD conversion by preparing a DAC reference signal for converting upper bits and by preparing that for converting lower bits.

It is desirable to provide an AD conversion method, an AD conversion apparatus, a solid-state imaging device, a solid-state imaging device deriving method, and an imaging device which increase AD conversion resolution with the same period of time.

It is desirable to provide an AD conversion method, an AD conversion apparatus, a solid-state imaging device, a solid-state imaging device deriving method, and an imaging device which reduce a circuit scale and a circuit size.

According to an embodiment of the present invention, there is provided an analog-to-digital conversion method for converting an analog signal to digital data, the analog-to-digital conversion method includes the steps of outputting an upper-bit conversion reference signal used for generating upper bits of digital data which is to be converted from an analog signal, comparing the analog signal with the upper-bit conversion reference signal by using a comparator and obtaining a digital value of the upper bits of the digital data on the basis of a period of time from a set time to the time when a magnitude relation between the analog signal and the upper-bit conversion reference signal is determined to be changed, generating and outputting a lower-bit conversion reference signal used for generating lower bits of the digital data, and comparing the analog signal with the lower-bit conversion reference signal by using the comparator, obtaining a digital value of the lower bits of the digital data on the basis of a period of time from a set time to the time when a magnitude relation between the analog signal and the lower-bit conversion reference signal is determined to be changed, and determining a digital value of digital data converted from the analog signal on the basis of the digital value of the upper bits and the digital value of the lower bits.

According to an embodiment of the present invention, there is provided an analog-to-digital conversion apparatus for converting an analog signal to digital data, the analog-to-digital conversion apparatus includes a comparator for comparing an analog signal with an upper-bit conversion reference signal used for generating upper bits of digital data which is to be converted from the analog signal and comparing the analog signal with a lower-bit conversion reference signal used for generating lower bits of the digital data, and an up/down counter for obtaining a digital value of the upper bits of the digital data on the basis of a period of time from a set time to the time when a magnitude relation between the analog signal and the upper-bit conversion reference signal is determined to be changed on the basis of a comparison result, which is obtained from the comparator, between the upper-bit conversion reference signal and the analog signal, obtaining a digital value of the lower bits of the digital data on the basis of a period of time from a set time to the time when a magnitude relation between the analog signal and the lower-bit conversion reference signal is determined to be changed on the basis of a comparison result, which is obtained from the comparator, between the lower-bit conversion reference signal and the analog signal, and converting the analog signal to digital data on the basis of the digital value of the upper bits and the digital value of the lower bits.

According to an embodiment of the present invention, there is provided a solid-state imaging device. The solid-state imaging device includes a pixel array in which unit pixels are arranged in a matrix, a row scanning circuit and a column scanning circuit for driving the pixel array, a digital-to-analog converter for generating an upper-bit conversion reference signal and a lower-bit conversion reference signal, an analog-to-digital converter circuit for comparing an analog signal output to a vertical signal line of the pixel array with the upper-bit conversion reference signal, comparing the analog signal with the lower-bit conversion reference signal, and converting the analog signal to digital data, a memory for temporarily storing the digital data converted from the analog signal by the analog-to-digital converter circuit, and a timing control circuit for controlling the pixel array, the row scanning circuit, the column scanning circuit, the digital-to-analog converter, the analog-to-digital converter circuit, and the memory. The analog-to-digital converter circuit includes a comparator for comparing the upper-bit conversion reference signal with the analog signal and comparing the lower-bit conversion reference signal with the analog signal, and an up/down counter for obtaining a digital value of upper bits of the digital data on the basis of a period of time from a set time to the time when a magnitude relation between the analog signal and the upper-bit conversion reference signal is determined to be changed on the basis of a comparison result, which is obtained from the comparator, between the upper-bit conversion reference signal and the analog signal, obtaining a digital value of lower bits of the digital data on the basis of a period of time from a set time to the time when a magnitude relation between the analog signal and the lower-bit conversion reference signal is determined to be changed on the basis of a comparison result, which is obtained from the comparator, between the lower-bit conversion reference signal and the analog signal, and converting the analog signal to digital data on the basis of the digital value of the upper bits and the digital value of the lower bits.

According to an embodiment of the present invention, there is provided a solid-state imaging device driving method. The solid-state imaging device driving method is used to drive a solid-state imaging device including a pixel array in which unit pixels are arranged in a matrix, a row scanning circuit and a column scanning circuit for driving the pixel array, a digital-to-analog converter for generating an upper-bit conversion reference signal and a lower-bit conversion reference signal, an analog-to-digital converter circuit for comparing an analog signal output to a vertical signal line of the pixel array with the upper-bit conversion reference signal, comparing the analog signal with the lower-bit conversion reference signal, and converting the analog signal to digital data, a memory for temporarily storing the digital data converted from the analog signal by the analog-to-digital converter circuit, and a timing control circuit for controlling the pixel array, the row scanning circuit, the column scanning circuit, the digital-to-analog converter circuit, the analog-to-digital converter circuit, and the memory. The solid-state imaging device driving method includes the steps of comparing the upper-bit conversion reference signal with the analog signal and comparing the lower-bit conversion reference signal with the analog signal by using a comparator included in the analog-to-digital converter circuit which is provided to each of vertical signal lines of the pixel array, and obtaining a digital value of upper bits of the digital data on the basis of a period of time from a set time to the time when a magnitude relation between the analog signal and the upper-bit conversion reference signal is determined to be changed on the basis of a comparison result, which is obtained from the comparator, between the upper-bit conversion reference signal and the analog signal, obtaining a digital value of lower bits of the digital data on the basis of a period of time from a set time to the time when a magnitude relation between the analog signal and the lower-bit conversion reference signal is determined to be changed on the basis of a comparison result, which is obtained from the comparator, between the lower-bit conversion reference signal and the analog signal, and converting the analog signal to the digital data on the basis of the digital value of the upper bits and the digital value of the lower bits by using an up/down counter included in the analog-to-digital converter circuit. In the solid-state imaging device driving method, the analog signals independently output to the vertical signal lines are simultaneously converted to the digital data.

According to an embodiment of the present invention, there is provided an imaging apparatus which includes a solid-state imaging device for taking an image of a subject, an imaging optical system for forming the image of the subject on a light-receiving portion of the solid-state imaging device, a driving control unit configured to drive the imaging optical system, a signal processor for processing an output signal sent from the solid-state imaging device and generating an imaging signal, a memory for storing the imaging signal generated by the signal processor, an output unit configured to output the imaging signal generated by the signal processor, and an operation unit configured to input a signal for controlling an operation of taking the image of the subject. The solid-state imaging device includes a pixel array in which unit pixels are arranged in a matrix, a row scanning circuit and a column scanning circuit for driving the pixel array, a digital-to-analog converter for generating an upper-bit conversion reference signal and a lower-bit conversion reference signal, an analog-to-digital converter circuit for comparing an analog signal output to a vertical signal line of the pixel array with the upper-bit conversion reference signal, comparing the analog signal with the lower-bit conversion reference signal, and converting the analog signal to digital data, a memory for temporarily storing the digital data converted from the analog signal by the analog-to-digital converter circuit, and a timing control circuit for controlling the pixel array, the row scanning circuit, the column scanning circuit, the digital-to-analog converter, the analog-to-digital converter circuit, and the memory. The analog-to-digital converter circuit includes a comparator for comparing the upper-bit conversion reference signal with the analog signal and comparing the lower-bit conversion reference signal with the analog signal, and an up/down counter for obtaining a digital value of upper bits of the digital data on the basis of a period of time from a set time to the time when a magnitude relation between the analog signal and the upper-bit conversion reference signal is determined to be changed on the basis of a comparison result, which is obtained from the comparator, between the upper-bit conversion reference signal and the analog signal, obtaining a digital value of lower bits of the digital data on the basis of a period of time from a set time to the time when a magnitude relation between the analog signal and the lower-bit conversion reference signal is determined to be changed on the basis of a comparison result, which is obtained from the comparator, between the lower-bit conversion reference signal and the analog signal, and converting the analog signal to the digital data on the basis of the digital value of the upper bits and the digital value of the lower bits.

According to embodiments of the present invention, by preparing a DAC reference signal for converting upper bits and by preparing that for converting lower bits, there is an advantage that the number of clock cycles necessary for performing AD conversion is reduced and also a period of time necessary for AD conversion is shortened.

For the same period of time, it is possible to have a resolution of AD conversion higher than that of the related art.

Furthermore, a decreased circuit scale or a decreased circuit size can be achieved.

DESCRIPTION OF THE PREFERRED EMBODIMENTS

An AD conversion method, an AD conversion apparatus, a solid-state imaging device and a solid-state imaging device driving method according to embodiments of the present invention will be described below with reference to the accompanying drawings.

According to the embodiments of the present invention, a function for reducing the number of clock cycles necessary for performing AD conversion and for shortening a period of time necessary for AD conversion can be provided by employing two DAC reference signals used in AD conversion. One of the DAC reference signals is for converting upper bits and the other one of the DAC reference signals is for converting lower bits. Moreover, for the same period of time, a resolution of AD conversion can be higher than that in the related art. Furthermore, an AD conversion apparatus and a solid-state imaging device that have a decreased circuit scale or a decreased circuit size can be provided.

Figure 1:
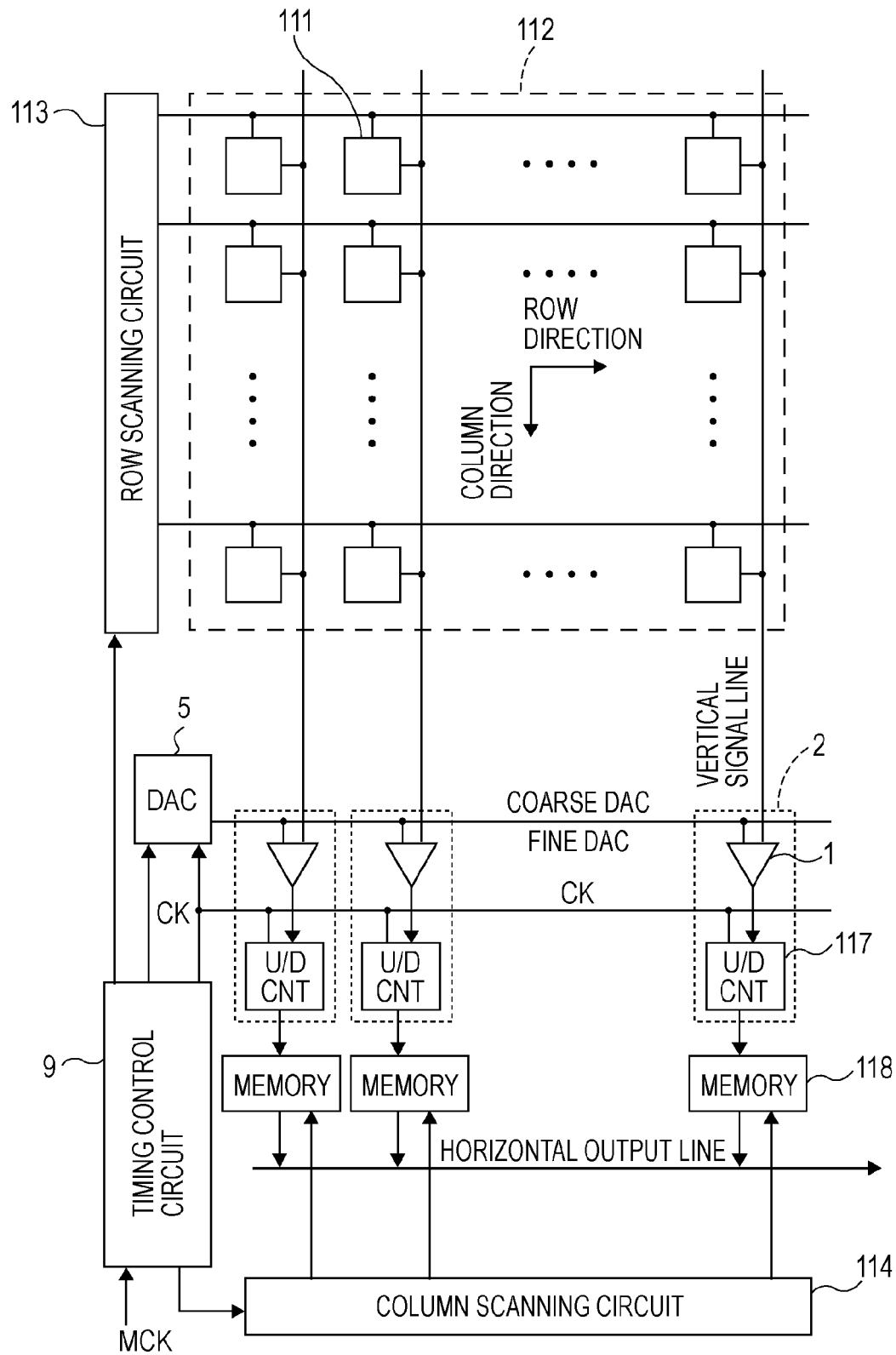
FIG. 1 is an exemplary schematic circuit diagram showing an exemplary MOS-type solid-state imaging device to which an AD conversion method and an AD conversion apparatus according to an embodiment of the present invention are applied.

FIG. 1 is an exemplary schematic circuit diagram showing an exemplary MOS-type solid-state imaging device to which an AD conversion method and an AD conversion apparatus according to an embodiment of the present invention are applied.

Figure 10:
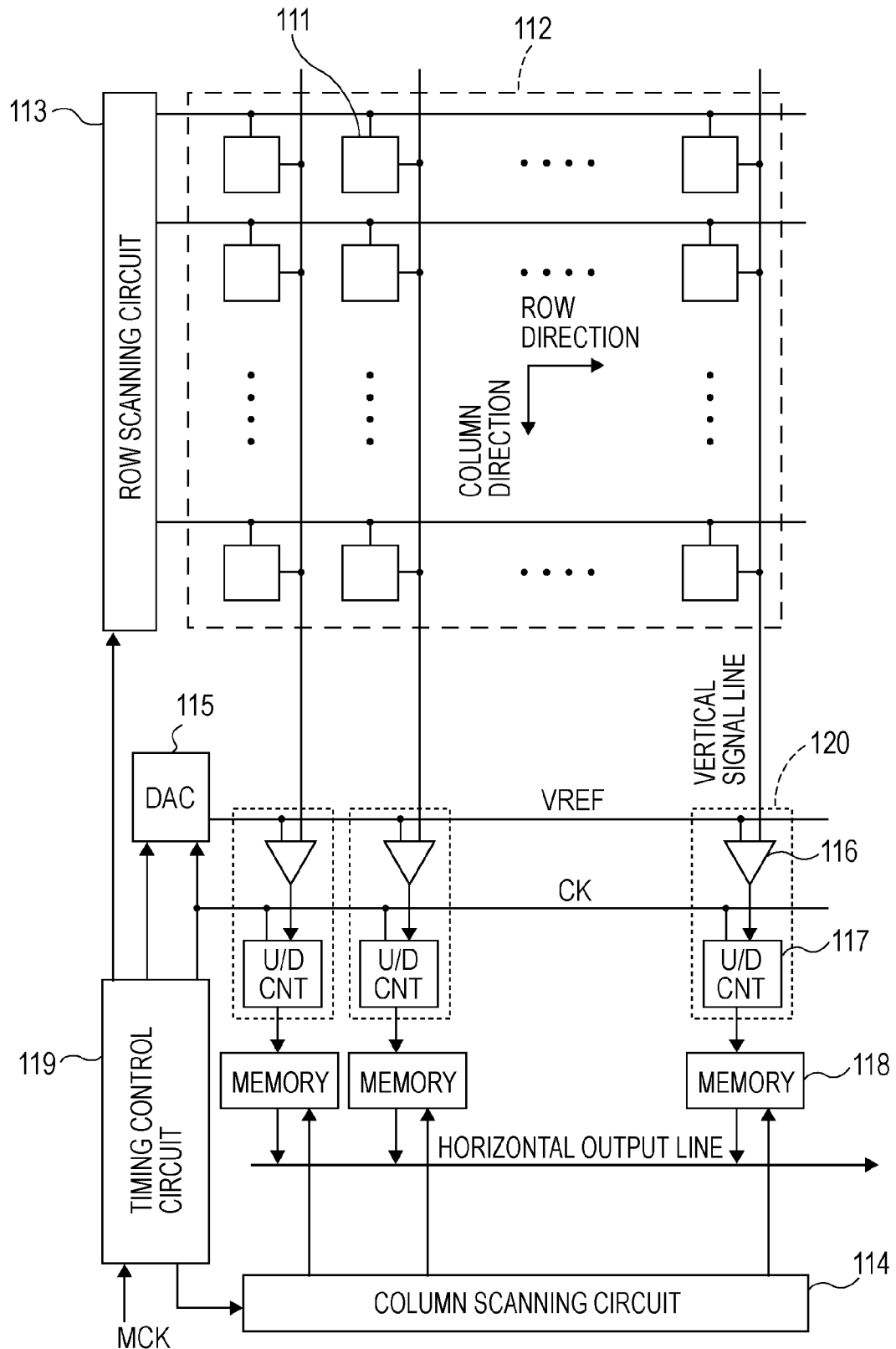
FIG. 10 is a schematic circuit diagram showing an exemplary MOS-type solid-state imaging device of the related art.
Figure 11:
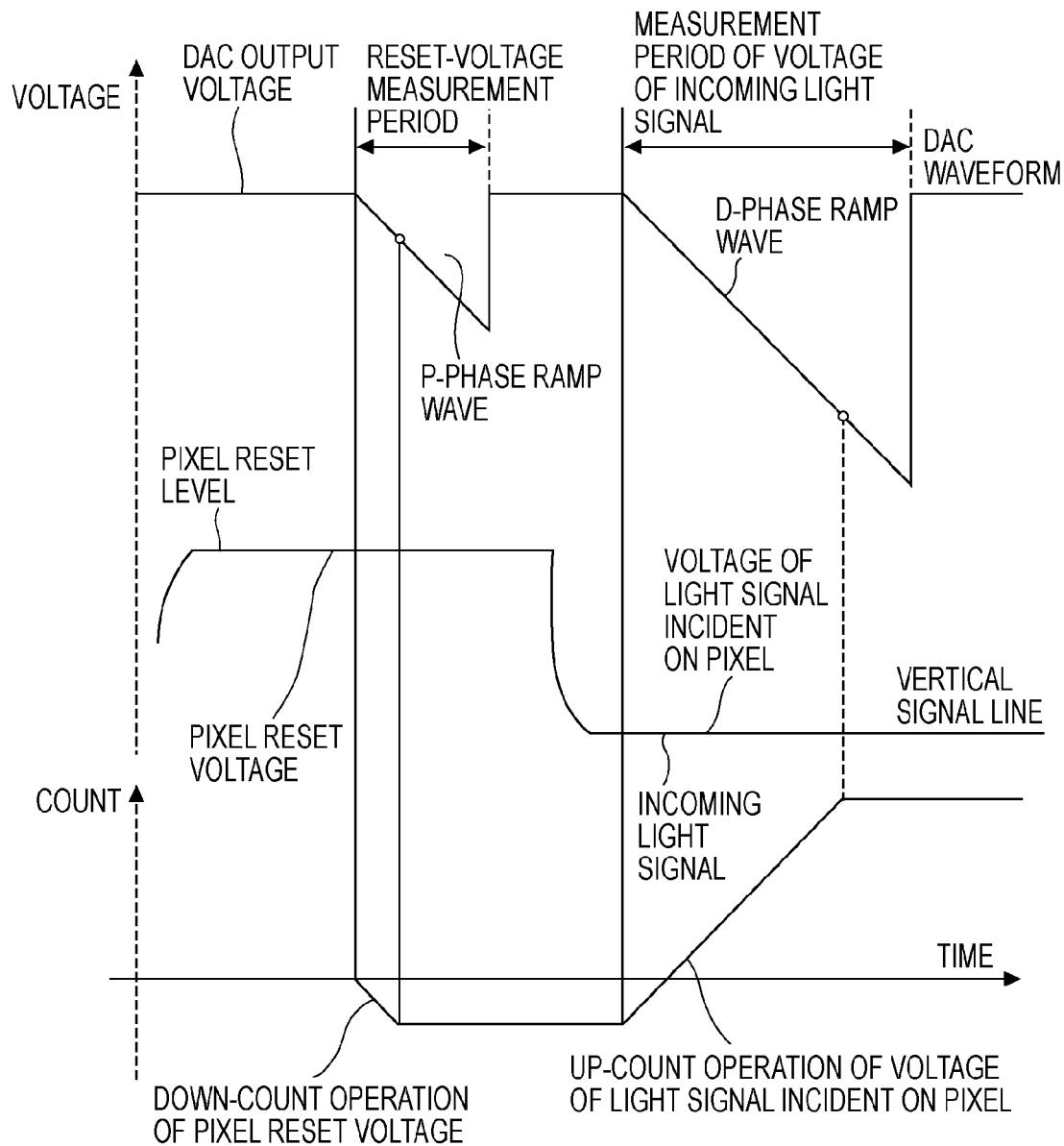
FIG. 11 is a timing chart showing an operation of the MOS-type solid-state imaging device of the related art.
Figure 12:
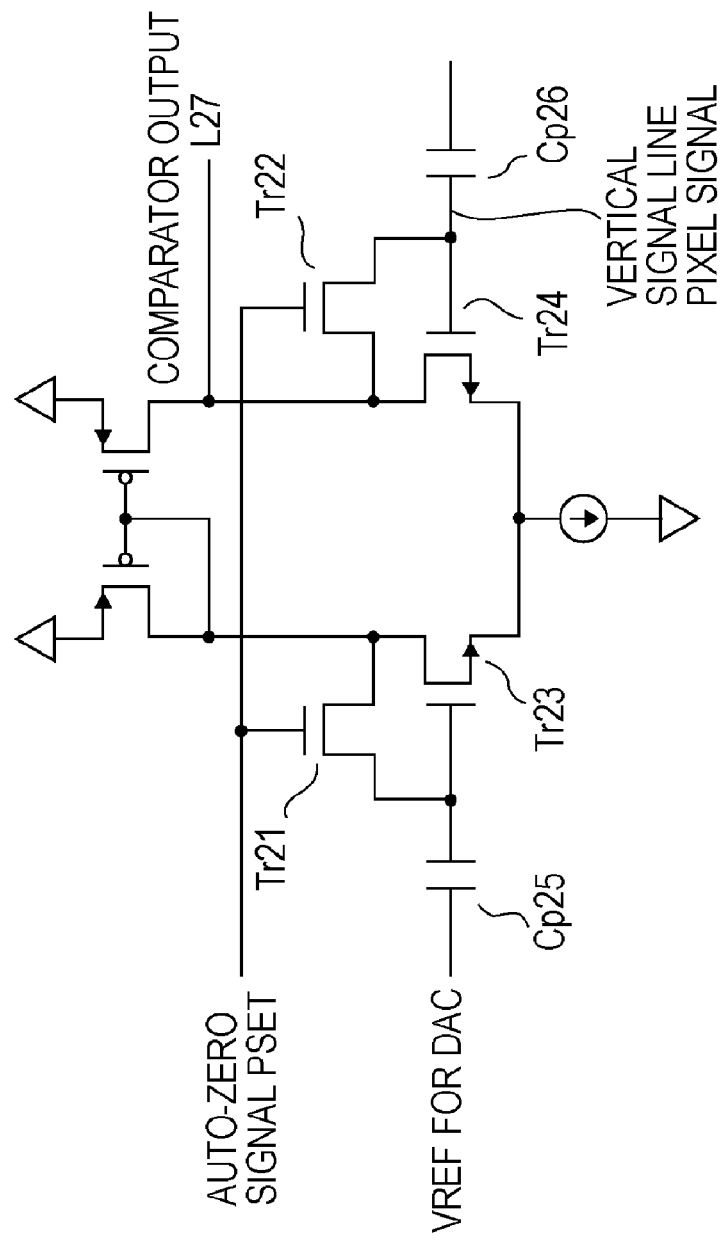
FIG. 12 is a schematic circuit diagram showing an exemplary structure of a comparator of an AD converter circuit in the MOS-type solid-state imaging device of the related art.
Figure 13:
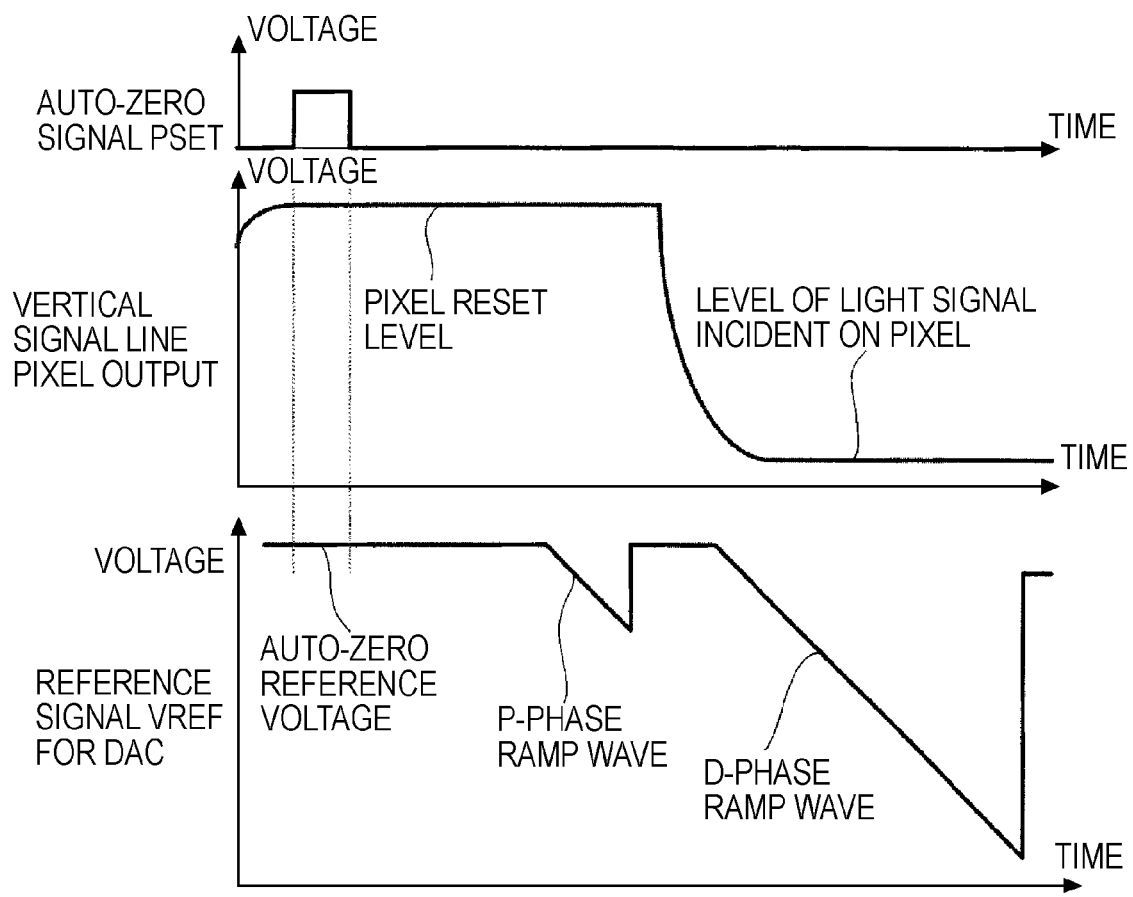
FIG. 13 is a timing chart showing an auto-zero signal, a pixel output of a vertical signal line, and a base signal supplied from a DAC in AD conversion which is performed on a pixel signal and which includes the auto-zero operation.
Figure 14:
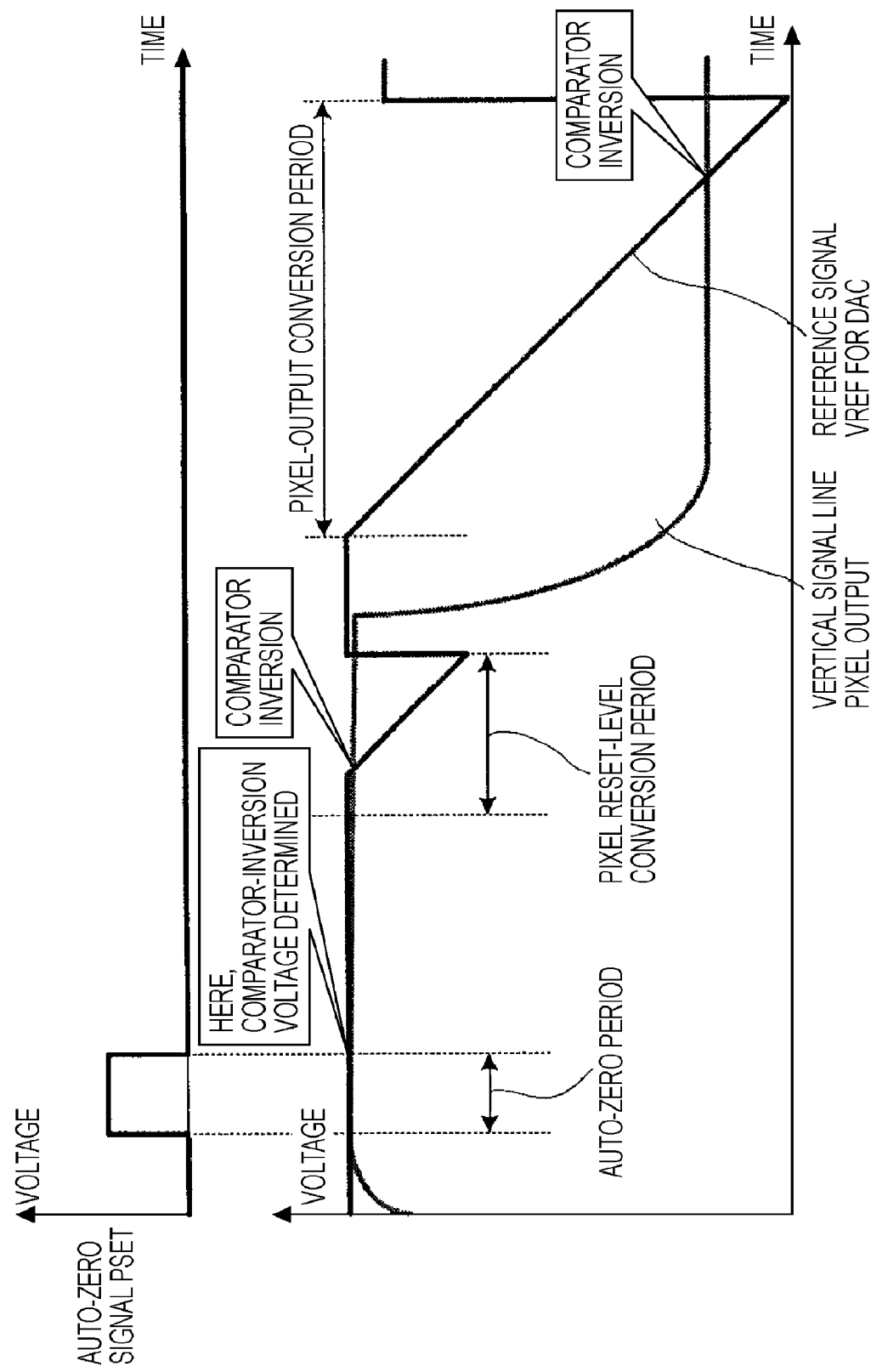
FIG. 14 is a timing chart showing that the vertical signal line at the time when the auto-zero voltage is maintained, and a voltage of the base signal supplied from the DAC reach a state of equilibrium of the comparator.
Figure 15:
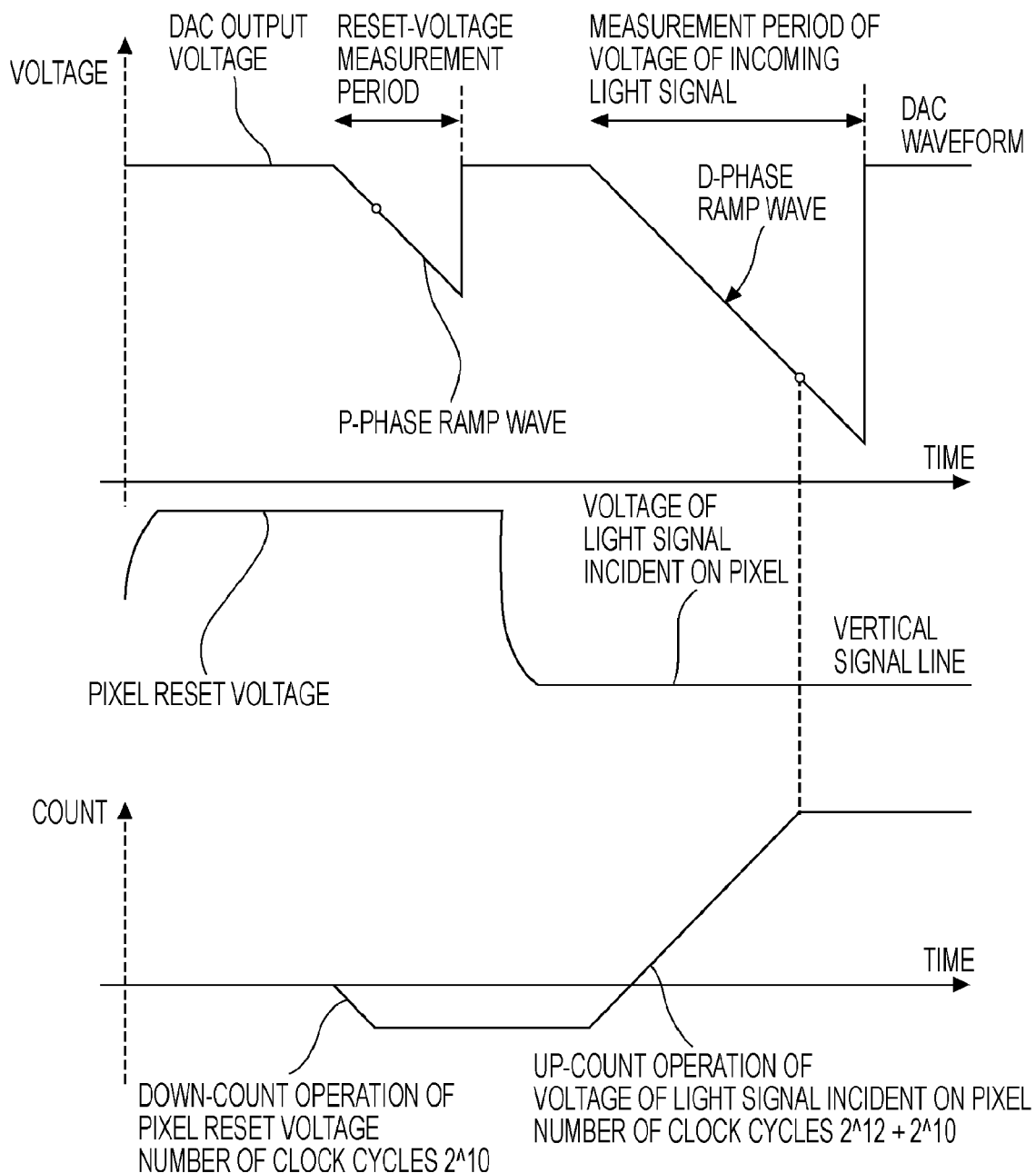
FIG. 15 is a timing chart of correlated double sampling performed in a solid-state imaging device of the related art.

Note that all the components except for an AD converter circuit 2 including a comparator 1, a DA converter 5, and a timing control circuit 9 shown in FIG. 1 are identical to corresponding components of the solid-state imaging device shown in FIG. 10 and are denoted by the same reference numerals shown in FIG. 10.

The MOS-type solid-state imaging device shown in FIG. 1 includes the pixel array 112 in which the unit pixels 111 are arranged in a matrix, the row scanning circuit 113 and column scanning circuit 114 for driving the pixel array 112, the DA converter 5 (hereinafter referred to as "DAC") for generating an upper-bit conversion reference signal (hereinafter referred to as a "coarse DAC") and a lower-bit conversion reference signal (hereinafter referred to as a "fine DAC"), the comparator 1 for comparing a vertical signal line voltage with the coarse DAC or fine DAC, the up/down counter 117 for performing both a digital operation and a storage operation, the memory 118 for storing data temporarily, and a timing control circuit 9 for controlling all the components described above in the MOS-type solid-state imaging device.

Next, operations will be described.

Figure 2:
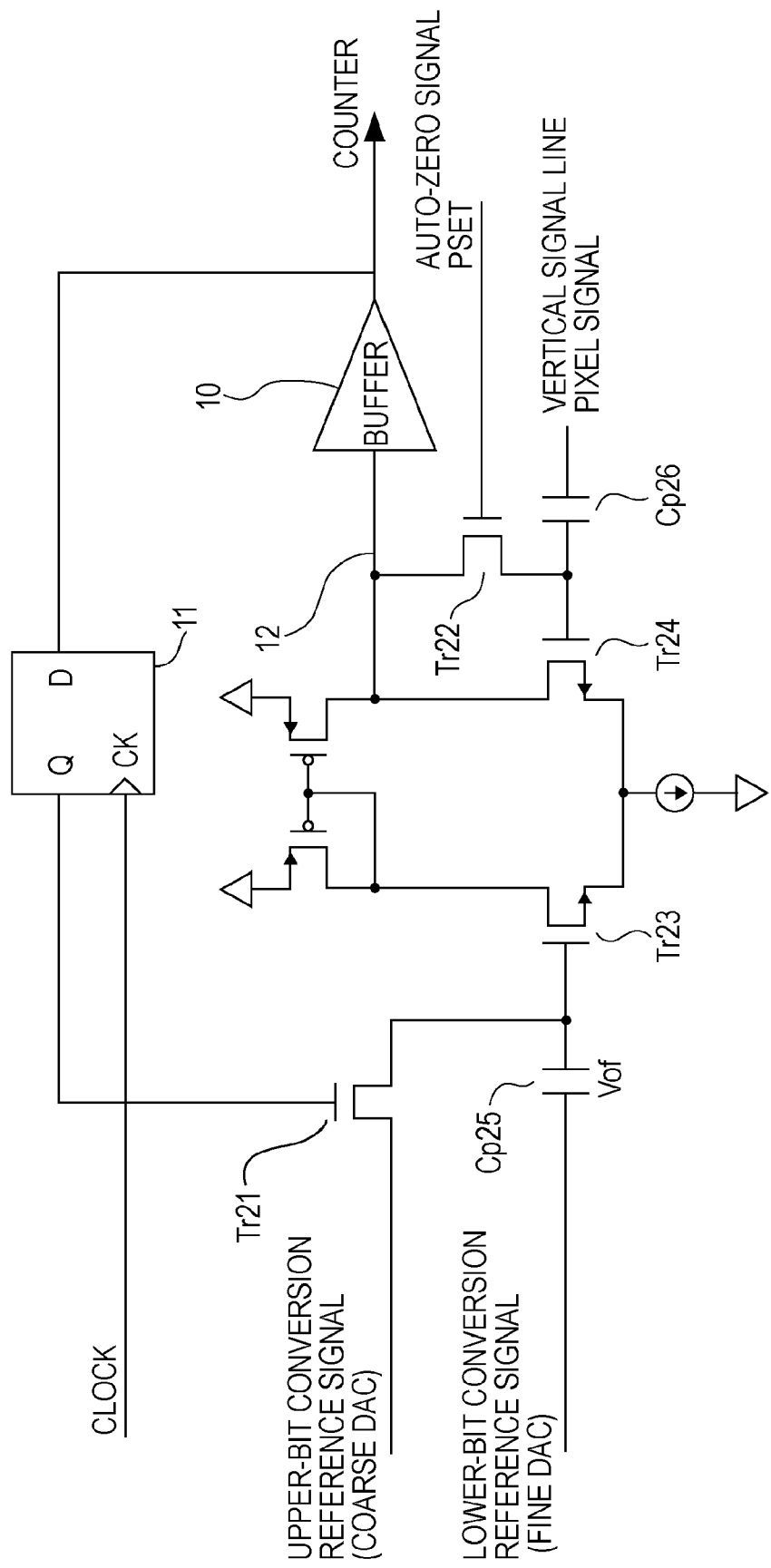
FIG. 2 is a schematic circuit diagram showing a comparator in an AD converter circuit which realizes the AD conversion method according to the embodiment of the present invention.
Figure 3:
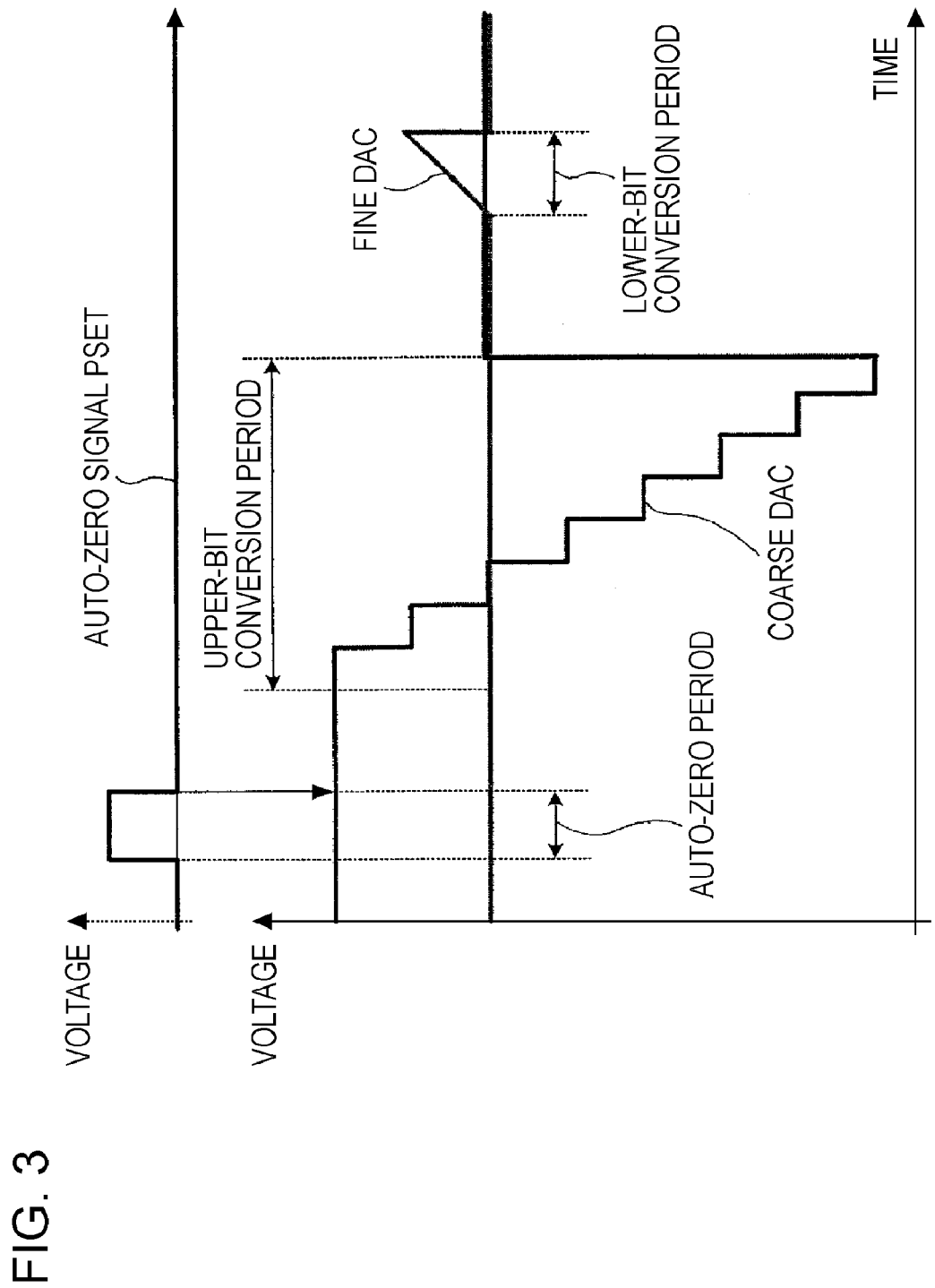
FIG. 3 is a driving waveform chart of AD conversion of a level of a light signal incident on a pixel in the AD converter circuit which realizes the AD conversion method according to the embodiment of the present invention.

FIG. 2 is a schematic circuit diagram showing the comparator 1 which is in the AD converter circuit 2 and which realizes the AD conversion method according to the embodiment of the present invention. FIG. 3 is a driving waveform chart showing AD conversion of a level of a light signal incident on a pixel.

According to the embodiment of the present invention, the number of upper bits is K and the number of lower bits is L.

First, an offset voltage of the comparator is eliminated and an inverted voltage of the comparator is set.

In order to do this, by setting a memory 11 at a high level, the switch transistor Tr21 is switched to an ON state. One terminal of the switch transistor Tr21 is connected between the capacitor Cp25 which is connected to a lower bit conversion reference signal line and the gate of the input transistor Tr23 of the comparator, and the other terminal of the switch transistor Tr21 is connected to an upper-bit conversion reference signal line.

Moreover, by setting the auto-zero signal PSET at a "high" level, the switch transistor Tr22 is switched to an ON state. One terminal of the switch transistor Tr22 is connected between the capacitor Cp26 which is connected to the vertical signal line and the gate of the input transistor Tr24 of the comparator, and the other terminal of the switch transistor Tr22 is connected to a line of a comparator output 12.

It is possible to only switch the switch transistor Tr22 to an OFF state by setting the coarse DAC and the fine DAC to be in a state of the auto-zero level shown in FIG. 3, and by setting the auto-zero signal PSET at the "low" level in a state in which a reset level serving as the pixel output is output to the vertical signal line.

Because of this auto-zero operation, an offset voltage of the comparator is maintained as a voltage across the capacitor Cp26, and furthermore, an inverted voltage of the comparator is set.

First, the AD conversion is performed on the upper bits.

A voltage waveform of the coarse DAC serving as the upper-bit conversion reference signal starts from a potential higher than the inverted voltage of the comparator, and generates a waveform having $2^K$ steps (K is the number of upper bits).

The comparator compares a potential level of the vertical signal line when light is incident on a pixel with that of the coarse DAC, and performs an up-count operation for the upper bits when the potential level of the coarse DAC is higher than that of the vertical signal line.

If the potential level of the coarse DAC becomes lower than that of the vertical signal line, the up-count operation for the upper bits stops, the comparator output 12 of FIG. 2 is stored in the memory 11 via a buffer 10, and the switch transistor Tr21 is in an OFF state.

When the switch transistor Tr21 is in the OFF state, a potential difference V of between the fine DAC and the coarse DAC is maintained as a voltage across the capacitor Cp25 located between the fine DAC and the input transistor Tr23 of the comparator.

Next, the AD conversion is performed on the lower bits.

A value of the fine DAC changes in steps for the number of steps equal to $2^L$ (L is the number of lower bits) and is compared with the level of the vertical signal line when light is incident on the pixel.

Since a potential difference for the number of upper bits has already been maintained, as an offset, across the capacitor Cp25 for the DAC, the fine DAC seems, from the comparator, to be shifted for the offset voltage V of from the inverted potential set by the auto-zero operation performed at the beginning. The voltage of the fine DAC changes in steps during a period of time corresponding to a count of the number of lower bits under a condition in which an amplitude of one step of the voltage of the coarse DAC serves as a full range. A down-count operation for the lower bits by using the fine DAC starts from a final count value obtained as a result of the up-count operation for the upper bits.

Figure 4:
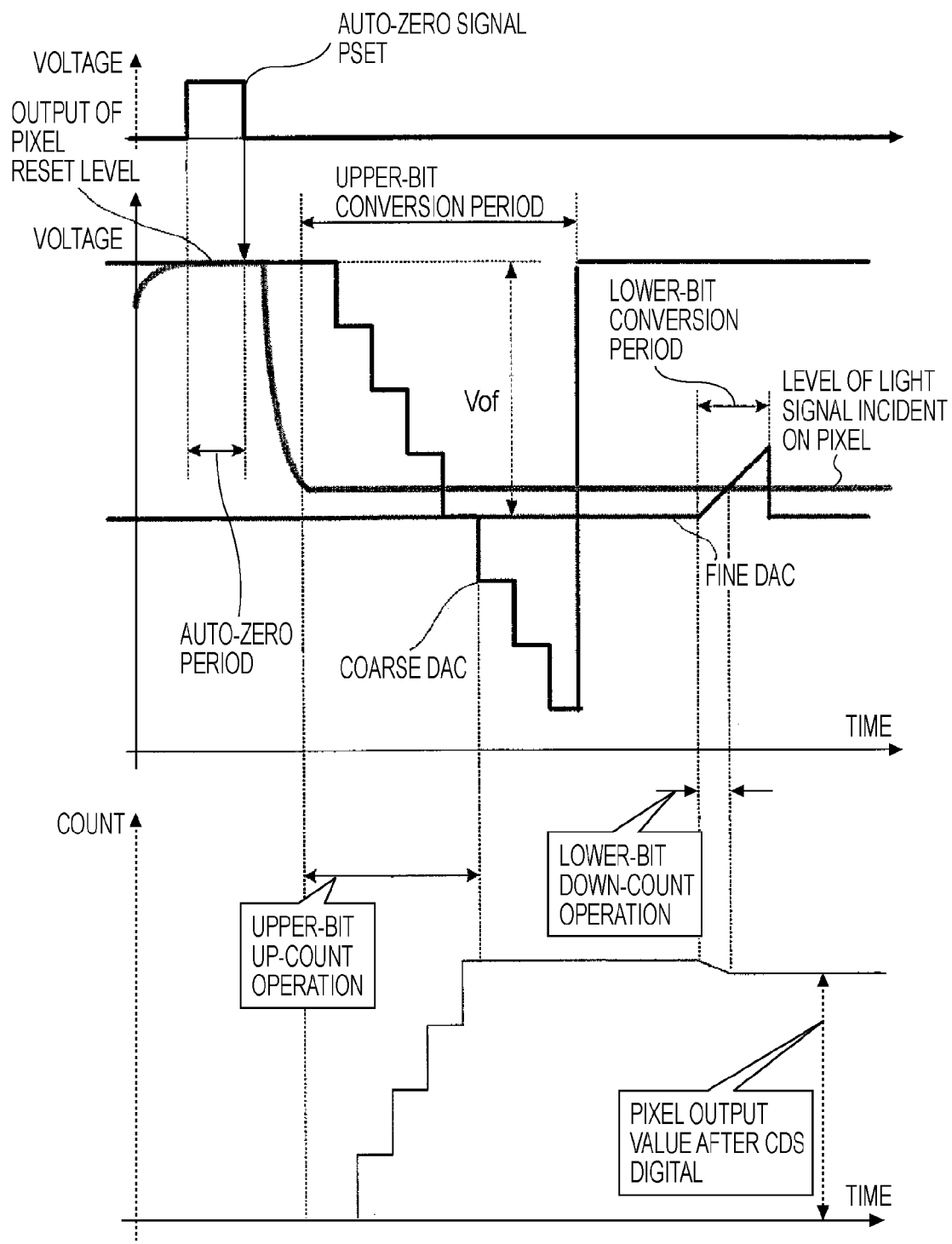
FIG. 4 is a timing chart showing an AD conversion operation performed on upper bits and an AD conversion operation performed on lower bits for the level of the light signal incident on the pixel in the AD converter circuit which realizes the AD conversion method according to the embodiment of the present invention.

FIG. 4 is a timing chart showing an AD conversion operation performed on the upper bits and an AD conversion operation performed on the lower bits of the level of the light signal incident on the pixel as described above.

Note that the level of the light signal incident on the pixel, which is independently output to every vertical signal line of the pixel array 112. The light signals independently output to the vertical signal lines of the pixel array 112 can be simultaneously converted from analog to digital by performing AD conversion on the upper bits and performing AD conversion on the lower bits.

When an AD converter with a resolution of J bits which is identical to that used in Japanese Unexamined Patent Application Publication No. 2005-278135 is employed, the time necessary for performing AD conversion once is compared with the time necessary for performing AD conversion in the techniques disclosed in Japanese Unexamined Patent Application Publication No. 2005-278135. In the technology disclosed in Japanese Unexamined Patent Application Publication No. 2005-278135, it is necessary to perform voltage comparison $2^J$ times in order to obtain the resolution of AD conversion. On the other hand, according to the embodiment of the present invention, it is necessary to perform voltage comparison $2^K+2^L$ times, where J=K+L.

In the above operation example, conversion of the level of the light signal incident on the pixel is described; however, the auto-zero offset voltage that is not possible to be removed completely in the auto-zero operation performed at the comparator can be eliminated by performing AD conversion on the pixel reset level in addition to AD conversion on the level of the light signal incident on the pixel.

Figure 5:
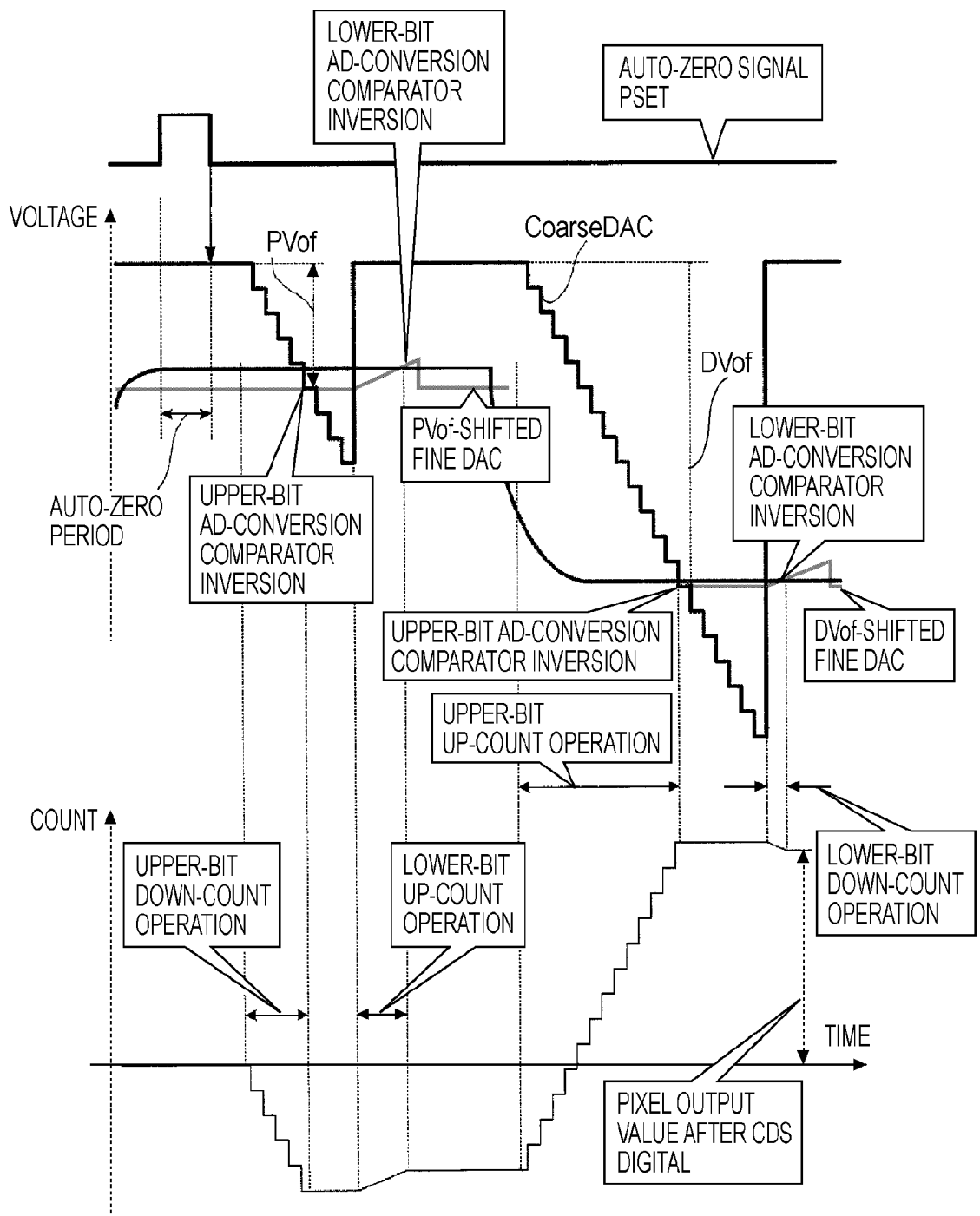
FIG. 5 is a timing chart showing an exemplary driving waveform obtained by performing correlated double sampling on a pixel reset level and the level of the light signal incident on the pixel in the AD converter circuit which realizes the AD conversion method according to the embodiment of the present invention.

FIG. 5 is a timing chart showing an exemplary driving waveform obtained by performing CDS on a pixel reset level and the level of the light signal incident on the pixel.

FIG. 5 shows a potential of the fine DAC as a potential shifted by the coarse DAC. After the auto-zero operation is completed, a down-count operation for the upper bits of the pixel reset level is performed and an up-count operation for the lower bits of the pixel reset level is performed.

The upper bits of the level of the light signal incident on the pixel is converted by performing the down-count operation starting from a final count value resulted from AD conversion of the pixel reset level, and then the lower bits is converted by performing the up-count operation. As a result, the fixed-pattern noise due to the use of the output circuit of the pixel is eliminated, and a digital value can be obtained for an output of the pixel.

As practical characteristics, the coarse DAC and fine DAC which have reference voltages for AD conversion have the problem of integral nonlinearity.

In the AD conversion, one step of the coarse DAC during conversion of the upper bits has the same width as the full range of the fine DAC during conversion of the lower bits; however, because of an integration error of the fine DAC, one step of the coarse DAC may be smaller than the full range of the fine DAC.

In this case, a problem may occur in which it is not possible to perform AD conversion on the fine DAC properly. This problem occurs at the boundary between the steps of the coarse DAC to which reference is made during the conversion of the upper bits.

Figure 6:
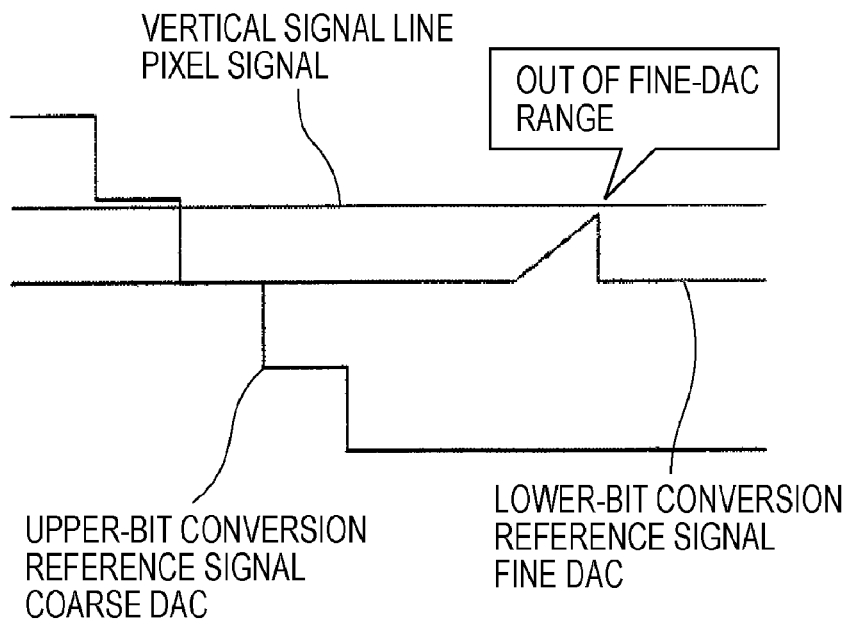
FIG. 6 is a diagram showing a state in which it is not possible to perform AD conversion on a fine DAC properly.

FIG. 6 is a diagram showing a state in which it is not possible to perform AD conversion on the fine DAC properly.

This problem can be avoided by converting three steps of the lower bits of the fine DAC, the three steps being one of the steps used in the conversion of the upper bits and two adjacent steps.

Figure 7:
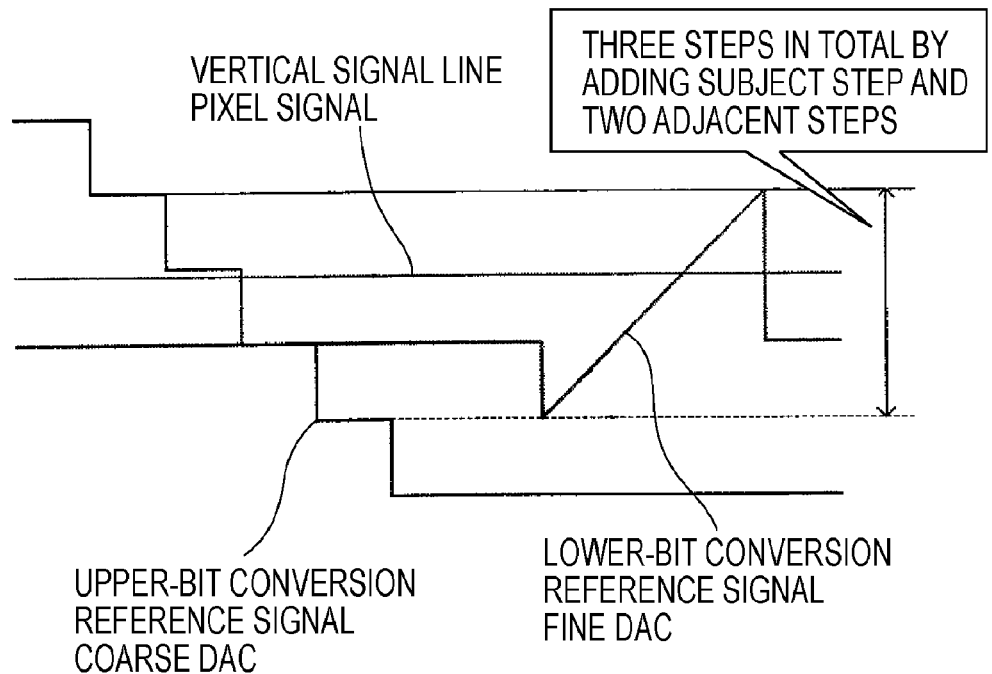
FIG. 7 is a diagram showing a solution for the state in which it is not possible to perform the AD conversion on the fine DAC properly.

FIG. 7 is a diagram showing a solution for the state in which it is not possible to perform AD conversion on the fine DAC properly.

Note that, in this case, since conversion of the lower bits of the fine DAC starts from a value which is one step lower than the offset voltage V of maintained when the upper bits are converted, it is necessary to add one to an initial value of the count for the upper bits.

Figure 8:
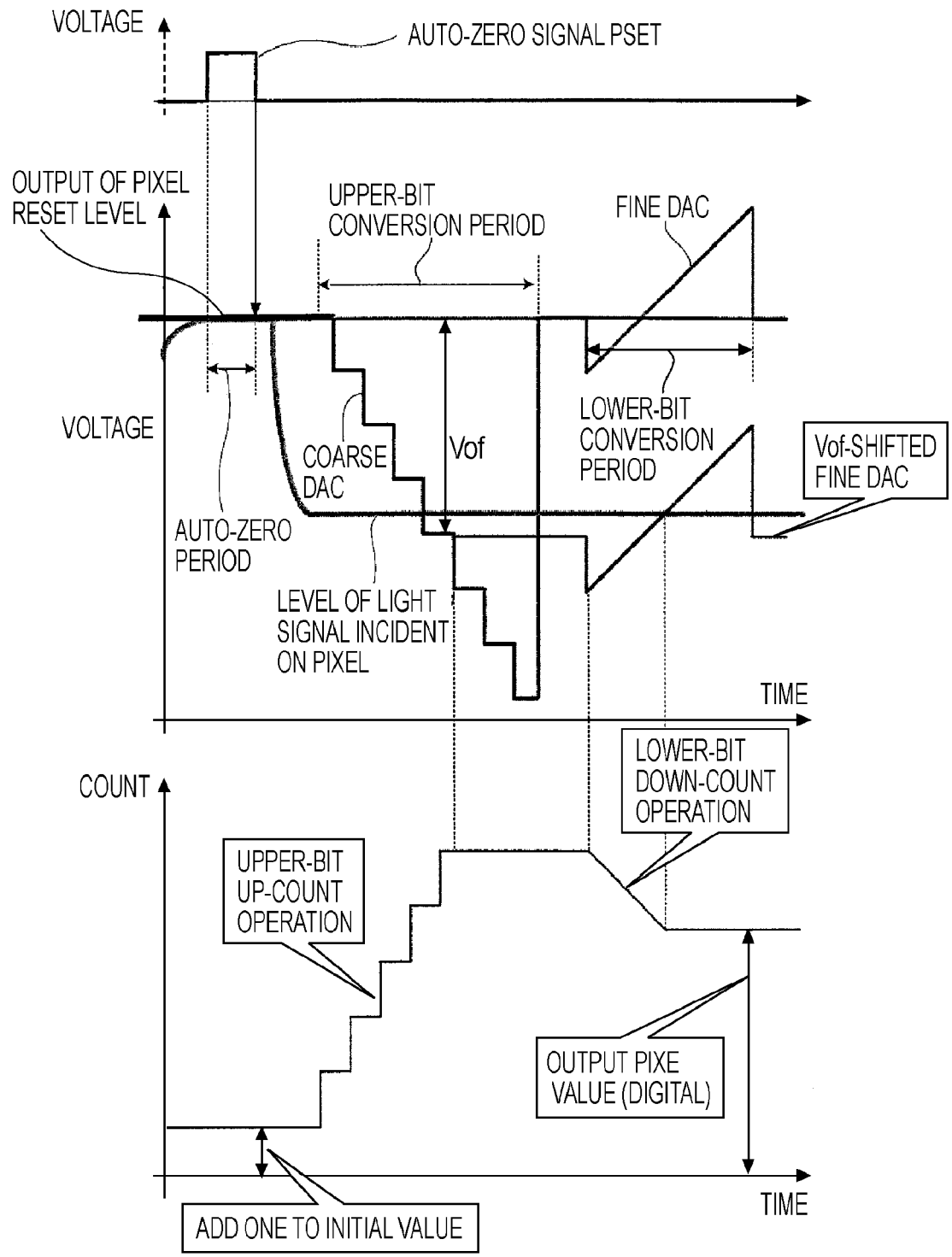
FIG. 8 is a timing chart showing a solution for the state in which it is not possible to perform the AD conversion on the fine DAC properly in the case in which a counter is included.

FIG. 8 is a timing chart which shows a solution for the state in which it is not possible to perform AD conversion on the fine DAC properly in the case in which a counter is included.

As shown in the timing chart of FIG. 8, an up-count operation starts from one in the case of the conversion of the upper bits in this example.

When the coarse DAC in the case of the conversion of the upper bits crosses the level of the vertical signal line, a count operation for the upper bits stops and maintains a potential difference between the fine DAC and the coarse DAC at that time.

In the case of the conversion of the lower bits, a down-count operation is performed starting from the final count value obtained in the conversion of the upper bits.

In this case, a potential of the fine DAC changes by three steps from the voltage level obtained at one step lower than a subject coarse DAC. This enables AD conversion to be properly performed even if there exists an error in integral non-linearity of the coarse DAC and the fine DAC.

As described above, according to the embodiment of the present invention, there is an advantage that an AD conversion method, an AD conversion apparatus, a solid-state imaging device, and a solid-state imaging device driving method which can reduce the number of clock cycles necessary for performing AD conversion and also shorten the period of time necessary for AD conversion can be provided by preparing a DAC reference signal for converting upper bits and by preparing that for converting lower bits. Moreover, there is an advantage that, for the same period of time, an AD conversion method, an AD conversion apparatus, a solid-state imaging device, and a solid-state imaging device driving method have a resolution of AD conversion higher than that in the related art can be provided.

In particular, if AD converters are aligned in columns and parallel with each other in a solid-state imaging device in which pixels are more densely aligned, there is an advantage that a circuit scale or a circuit size of each of the AD converters aligned in columns can be reduced.

Figure 9:
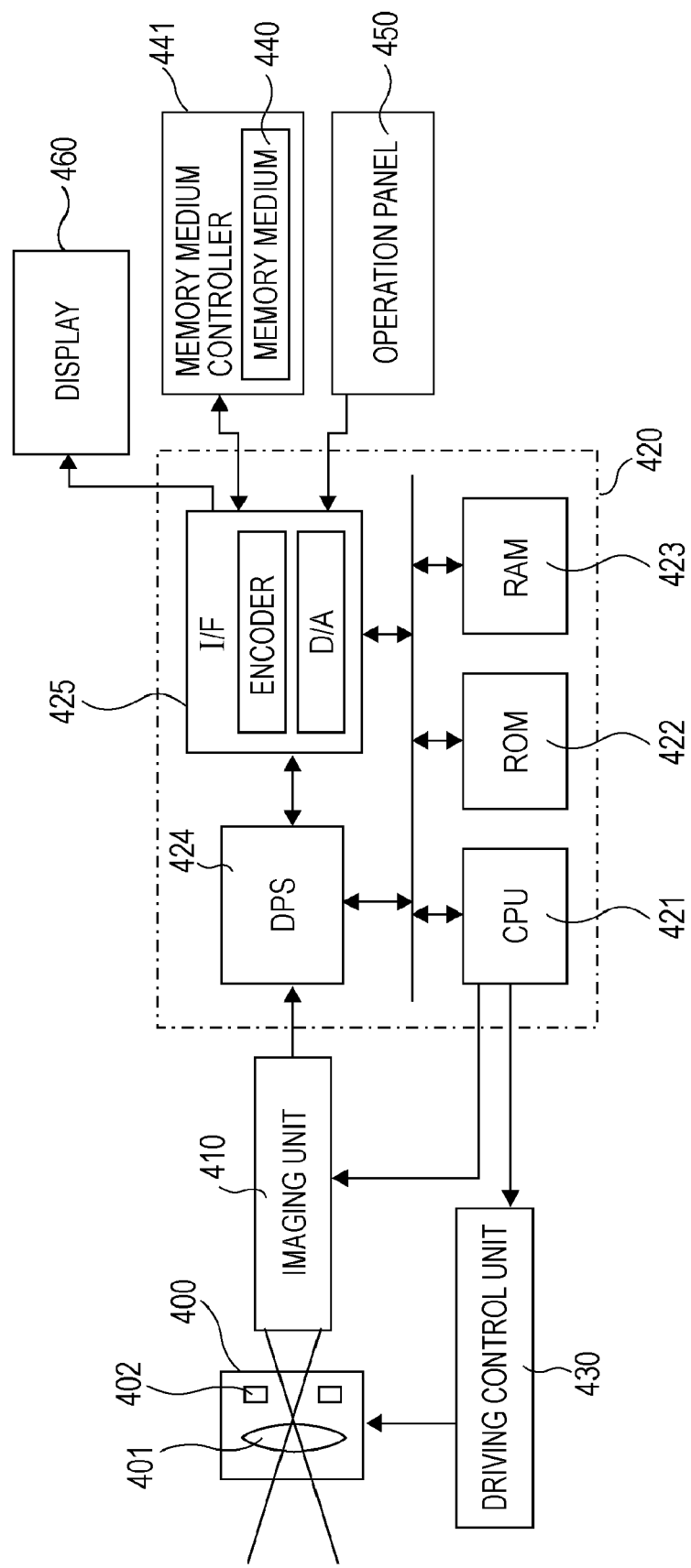
FIG. 9 is a block diagram showing an exemplary structure of a camera apparatus in which a MOS-type solid-state imaging device according to the embodiment of the present invention is used.

FIG. 9 is a block diagram showing an exemplary structure of a camera apparatus in which a MOS-type solid-state imaging device according to the embodiment of the present invention is used.

In FIG. 9, an imaging unit 410 takes an image of a subject by using, for example, the MOS-type solid-state imaging device shown in FIG. 1. The imaging unit 410 outputs an imaging signal to a system control unit 420 mounted on a main substrate.

In other words, the imaging unit 410 performs, for example, automatic gain control (AGC), optical black (OB) clamp, CDS, and AD conversion on an output signal from the MOS-type solid-state imaging device, and generates and outputs a digital imaging signal.

An imaging optical system 400 includes a zoom lens 401, a diaphragm adjusting mechanism 402, and the like disposed in a lens tube. The imaging optical system 400 is for forming the image of the subject on a light-receiving portion of the MOS-type solid-state imaging device. A driving control unit 430 based on the system control unit 420 performs control so as to mechanically drive the portions included in the imaging optical system 400, so that automatic focusing is controlled.

The system control unit 420 includes a central processing unit (CPU) 421, a read-only memory (ROM) 422, a random-access memory (RAM) 423, a digital signal processor (DSP) 424, an external interface 425, and the like.

The CPU 421 sends an instruction to each of portions in the camera apparatus by using the ROM 422 and the RAM 423, and controls the overall system.

The DSP 424 performs various signal processing on the imaging signal sent from the imaging unit 410, and generates a still image signal or a moving image signal (for example, a YUV signal or the like) based on a predetermined format.

The external interface 425 includes a type of encoder and a DA converter. Various control signals or data is exchanged between an external element (a memory medium 440, a operation panel 450, or a display 460 according to the embodiment of the present invention) and the external interface 425.

The display 460 is a small display device, for example, a liquid crystal panel or the like, mounted in the camera apparatus according to the embodiment of the present invention, and displays an image taken. Note that, as a matter of course, image data can be sent to and displayed on an external large display apparatus in addition to the small display device mounted in such a camera apparatus.

The memory medium 440 is, for example, a memory card or the like in which a taken image signal can be stored properly, and is removable from, for example, a memory medium controller 441. As such a memory medium 440, a memory card of any kind, a magnetic disk medium, an optical disk medium, or the like can be employed.

The operation panel 450 has input keys for inputting various instructions made by a user when an image is taken with the camera apparatus according to the embodiment of the present invention. The CPU 421 detects an input signal sent from the operation panel 450, and executes various operation controls on the basis of the instruction indicated by the input signal.

Even such a camera apparatus can have a similar advantage as described above by applying the embodiment of the present invention.

Note that in the above-described structures, various combinations of one or more unit devices and/or one or more unit modules as structural elements of a system, or a size of a set including such combinations may be selected on the basis of requirements of commercialization or the like. An imaging apparatus according to an embodiment of the present invention may include a wide variety of modifications.

It should be understood by those skilled in the art that various modifications, combinations, sub-combinations and alterations may occur depending on design requirements and other factors insofar as they are within the scope of the appended claims or the equivalents thereof.

What is claimed is:

1. An analog-to-digital conversion method for converting an analog signal to digital data, the analog-to-digital conversion method comprising the steps of:
outputting an upper-bit conversion reference signal used for generating upper bits of digital data which is to be converted from an analog signal;
comparing the analog signal with the upper-bit conversion reference signal by using a comparator and obtaining a digital value of the upper bits of the digital data on the basis of a period of time from a set time to the time when a magnitude relation between the analog signal and the upper-bit conversion reference signal is determined to be changed;
generating and outputting a lower-bit conversion reference signal used for generating lower bits of the digital data; and
comparing the analog signal with the lower-bit conversion reference signal by using the comparator, obtaining a digital value of the lower bits of the digital data on the basis of a period of time from a set time to the time when a magnitude relation between the analog signal and the lower-bit conversion reference signal is determined to be changed, and determining a digital value of digital data converted from the analog signal on the basis of the digital value of the upper bits and the digital value of the lower bits.

2. The analog-to-digital conversion method according to claim 1, wherein the lower-bit conversion reference signal which is compared with the analog signal by the comparator is a signal based on the upper-bit conversion reference signal corresponding to the digital value of the upper bits obtained on the basis of the period of time from the set time to the time when the magnitude relation between the analog signal and the upper-bit conversion reference signal is determined to be changed.

3. The analog-to-digital conversion method according to claim 1, wherein the upper-bit conversion reference signal and the lower-bit conversion reference signal are signals whose value changes in steps, and the lower-bit conversion reference signal is the signal whose value changes in steps during a period of time corresponding to a count of the number of lower bits within a full range of the lower-bit conversion reference signal, the full range corresponding to an amplitude of a unit step of the upper-bit conversion reference signal.

4. The analog-to-digital conversion method according to claim 1, further comprising the step of compensating for an amount of an offset of the comparator.

5. An analog-to-digital conversion apparatus for converting an analog signal to digital data, the analog-to-digital conversion apparatus comprising:
a comparator for comparing an analog signal with an upper-bit conversion reference signal used for generating upper bits of digital data which is to be converted from the analog signal and comparing the analog signal with a lower-bit conversion reference signal used for generating lower bits of the digital data; and
an up/down counter for obtaining a digital value of the upper bits of the digital data on the basis of a period of time from a set time to the time when a magnitude relation between the analog signal and the upper-bit conversion reference signal is determined to be changed on the basis of a comparison result, which is obtained from the comparator, between the upper-bit conversion reference signal and the analog signal, obtaining a digital value of the lower bits of the digital data on the basis of a period of time from a set time to the time when a magnitude relation between the analog signal and the lower-bit conversion reference signal is determined to be changed on the basis of a comparison result, which is obtained from the comparator, between the lower-bit conversion reference signal and the analog signal, and converting the analog signal to digital data on the basis of the digital value of the upper bits and the digital value of the lower bits.

6. The analog-to-digital conversion apparatus according to claim 5, wherein the lower-bit conversion reference signal which is compared with the analog signal by the comparator is a signal based on the upper-bit conversion reference signal corresponding to the digital value of the upper bits obtained on the basis of the period of time from the set time to the time when the magnitude relation between the analog signal and the upper-bit conversion reference signal is determined to be changed.

7. The analog-to-digital conversion apparatus according to claim 5, wherein the upper-bit conversion reference signal and the lower-bit conversion reference signal are signals whose value changes in steps, and the lower-bit conversion reference signal is the signal whose value changes in steps during a period of time corresponding to a count of the number of lower bits within a full range of the lower-bit conversion reference signal, the full range corresponding to an amplitude of a unit step of the upper-bit conversion reference signal.

8. The analog-to-digital conversion apparatus according to claim 5, further comprising an offset elimination circuit for compensating for an amount of an offset of the comparator.

9. A solid-state imaging device comprising:
a pixel array in which unit pixels are arranged in a matrix;
a row scanning circuit and a column scanning circuit for driving the pixel array;
a digital-to-analog converter for generating an upper-bit conversion reference signal and a lower-bit conversion reference signal;
an analog-to-digital converter circuit for comparing an analog signal output to a vertical signal line of the pixel array with the upper-bit conversion reference signal, comparing the analog signal with the lower-bit conversion reference signal, and converting the analog signal to digital data;
a memory for temporarily storing the digital data converted from the analog signal by the analog-to-digital converter circuit; and
a timing control circuit for controlling the pixel array, the row scanning circuit, the column scanning circuit, the digital-to-analog converter, the analog-to-digital converter circuit, and the memory,
wherein the analog-to-digital converter circuit includes
a comparator for comparing the upper-bit conversion reference signal with the analog signal and comparing the lower-bit conversion reference signal with the analog signal, and
an up/down counter for obtaining a digital value of upper bits of the digital data on the basis of a period of time from a set time to the time when a magnitude relation between the analog signal and the upper-bit conversion reference signal is determined to be changed on the basis of a comparison result, which is obtained from the comparator, between the upper-bit conversion reference signal and the analog signal, obtaining a digital value of lower bits of the digital data on the basis of a period of time from a set time to the time when a magnitude relation between the analog signal and the lower-bit conversion reference signal is determined to be changed on the basis of a comparison result, which is obtained from the comparator, between the lower-bit conversion reference signal and the analog signal, and converting the analog signal to digital data on the basis of the digital value of the upper bits and the digital value of the lower bits.

10. The solid-state imaging device according to claim 9, wherein the lower-bit conversion reference signal which is compared with the analog signal by the comparator is a signal based on the upper-bit conversion reference signal corresponding to the digital value of the upper bits obtained on the basis of the period of time from the set time to the time when the magnitude relation between the analog signal and the upper-bit conversion reference signal is determined to be changed.

11. The solid-state imaging device according to claim 9, wherein the upper-bit conversion reference signal and the lower-bit conversion reference signal are signals whose value changes in steps, and the lower-bit conversion reference signal is the signal whose value changes in steps during a period of time corresponding to a count of the number of lower bits within a full range of the lower-bit conversion reference signal, the full range corresponding to an amplitude of a unit step of the upper-bit conversion reference signal.

12. The solid-state imaging device according to claim 9, further comprising an offset elimination circuit for compensating for an amount of an offset of the comparator.

13. A solid-state imaging device driving method, a solid-state imaging device including a pixel array in which unit pixels are arranged in a matrix, a row scanning circuit and a column scanning circuit for driving the pixel array, a digital-to-analog converter for generating an upper-bit conversion reference signal and a lower-bit conversion reference signal, an analog-to-digital converter circuit for comparing an analog signal output to a vertical signal line of the pixel array with the upper-bit conversion reference signal, comparing the analog signal with the lower-bit conversion reference signal, and converting the analog signal to digital data, a memory for temporarily storing the digital data converted from the analog signal by the analog-to-digital converter circuit, and a timing control circuit for controlling the pixel array, the row scanning circuit, the column scanning circuit, the digital-to-analog converter circuit, the analog-to-digital converter circuit, and the memory, the solid-state imaging device driving method comprising the steps of:
  comparing the upper-bit conversion reference signal with the analog signal and comparing the lower-bit conversion reference signal with the analog signal by using a comparator included in the analog-to-digital converter circuit which is provided to each of vertical signal lines of the pixel array; and
  obtaining a digital value of upper bits of the digital data on the basis of a period of time from a set time to the time when a magnitude relation between the analog signal and the upper-bit conversion reference signal is determined to be changed on the basis of a comparison result, which is obtained from the comparator, between the upper-bit conversion reference signal and the analog signal, obtaining a digital value of lower bits of the digital data on the basis of a period of time from a set time to the time when a magnitude relation between the analog signal and the lower-bit conversion reference signal is determined to be changed on the basis of a comparison result, which is obtained from the comparator, between the lower-bit conversion reference signal and the analog signal, and converting the analog signal to the digital data on the basis of the digital value of the upper bits and the digital value of the lower bits by using an up/down counter included in the analog-to-digital converter circuit,
  wherein the analog signals independently output to the vertical signal lines are simultaneously converted to the digital data.

14. The solid-state imaging device driving method according to claim 13, wherein the lower-bit conversion reference signal which is compared with the analog signal by the comparator is a signal based on the upper-bit conversion reference signal corresponding to the digital value of the upper bits obtained on the basis of the period of time from the set time to the time when the magnitude relation between the analog signal and the upper-bit conversion reference signal is determined to be changed.

15. The solid-state imaging device driving method according to claim 13, wherein the upper-bit conversion reference signal and the lower-bit conversion reference signal are signals whose value changes in steps, and the lower-bit conversion reference signal is the signal whose value changes in steps during a period of time corresponding to a count of the number of lower bits within a full range of the lower-bit conversion reference signal, the full range corresponding to an amplitude of a unit step of the upper-bit conversion reference signal.

16. The solid-state imaging device driving method according to claim 13, further comprising the step of compensating for an amount of an offset of the comparator by using an offset elimination circuit.

17. An imaging apparatus comprising:
  a solid-state imaging device for taking an image of a subject;
  an imaging optical system for forming the image of the subject on a light-receiving portion of the solid-state imaging device;
  a driving control unit configured to drive the imaging optical system;
  a signal processor for processing an output signal sent from the solid-state imaging device and generating an imaging signal;
  a memory for storing the imaging signal generated by the signal processor;
  an output unit configured to output the imaging signal generated by the signal processor; and
  an operation unit configured to input a signal for controlling an operation of taking the image of the subject,
  wherein the solid-state imaging device includes
    a pixel array in which unit pixels are arranged in a matrix,
    a row scanning circuit and a column scanning circuit for driving the pixel array,
    a digital-to-analog converter for generating an upper-bit conversion reference signal and a lower-bit conversion reference signal,
    an analog-to-digital converter circuit for comparing an analog signal output to a vertical signal line of the pixel array with the upper-bit conversion reference signal, comparing the analog signal with the lower-bit conversion reference signal, and converting the analog signal to digital data,
    a memory for temporarily storing the digital data converted from the analog signal by the analog-to-digital converter circuit, and a timing control circuit for controlling the pixel array, the row scanning circuit, the column scanning circuit, the digital-to-analog converter, the analog-to-digital converter circuit, and the memory, and wherein the analog-to-digital converter circuit includes a comparator for comparing the upper-bit conversion reference signal with the analog signal and comparing the lower-bit conversion reference signal with the analog signal, and an up/down counter for obtaining a digital value of upper bits of the digital data on the basis of a period of time from a set time to the time when a magnitude relation between the analog signal and the upper-bit conversion reference signal is determined to be changed on the basis of a comparison result, which is obtained from the comparator, between the upper-bit conversion reference signal and the analog signal, obtaining a digital value of lower bits of the digital data on the basis of a period of time from a set time to the time when a magnitude relation between the analog signal and the lower-bit conversion reference signal is determined to be changed on the basis of a comparison result, which is obtained from the comparator, between the lower-bit conversion reference signal and the analog signal, and converting the analog signal to the digital data on the basis of the digital value of the upper bits and the digital value of the lower bits.

\* \* \* \* \*